United States Patent
Aoki et al.

(10) Patent No.: US 11,955,492 B2
(45) Date of Patent: Apr. 9, 2024

(54) DISPLAY DEVICE

(71) Applicant: Japan Display Inc., Tokyo (JP)

(72) Inventors: Yoshinori Aoki, Tokyo (JP); Yasuhiro Kanaya, Tokyo (JP); Akihiro Ogawa, Tokyo (JP)

(73) Assignee: Japan Display Inc., Tokyo (JP)

( * ) Notice: Subject to any disclaimer, the term of this patent is extended or adjusted under 35 U.S.C. 154(b) by 390 days.

(21) Appl. No.: 17/447,958

(22) Filed: Sep. 17, 2021

(65) Prior Publication Data

US 2022/0005833 A1    Jan. 6, 2022

Related U.S. Application Data

(63) Continuation of application No. PCT/JP2020/006032, filed on Feb. 17, 2020.

(30) Foreign Application Priority Data

Mar. 19, 2019 (JP) .................................. 2019-051586

(51) Int. Cl.
  *H01L 27/12* (2006.01)
  *H01L 25/16* (2023.01)
  *H01L 33/62* (2010.01)

(52) U.S. Cl.
  CPC .......... *H01L 27/124* (2013.01); *H01L 25/167* (2013.01); *H01L 27/1255* (2013.01); *H01L 33/62* (2013.01)

(58) Field of Classification Search
  None
  See application file for complete search history.

(56) References Cited

U.S. PATENT DOCUMENTS

| | | | |
|---|---|---|---|
| 10,008,465 B2 | 6/2018 | Bower | |
| 2002/0105040 A1* | 8/2002 | Yamazaki | H01L 29/78678 257/E21.414 |
| 2017/0133620 A1* | 5/2017 | Lee | H10K 71/00 |
| 2017/0179208 A1 | 6/2017 | Jang et al. | |
| 2018/0083218 A1* | 3/2018 | Choi | H10K 50/814 |
| 2018/0166429 A1* | 6/2018 | Chong | H01L 27/15 |
| 2018/0175268 A1* | 6/2018 | Moon | H01L 27/15 |

OTHER PUBLICATIONS

Taiwanese Office Action dated Mar. 16, 2021 in Taiwanese Application No. 109108547, 7 pages.

* cited by examiner

*Primary Examiner* — Robert K Carpenter
(74) *Attorney, Agent, or Firm* — Maier & Maier, PLLC

(57) ABSTRACT

According to one embodiment, a display device includes a display panel including a display area for displaying an image, and the display panel includes an insulating substrate, a first electrode, a first organic insulating layer, an inorganic insulating layer, a pixel electrode, a second organic insulating layer, and a pad portion. The inorganic insulating layer includes a first opening for electrically connecting the first electrode to the pixel electrode. The second organic insulating layer includes a second opening for electrically connecting the pixel electrode to the pad portion. The pixel electrode is formed of a transparent conductive material.

6 Claims, 6 Drawing Sheets

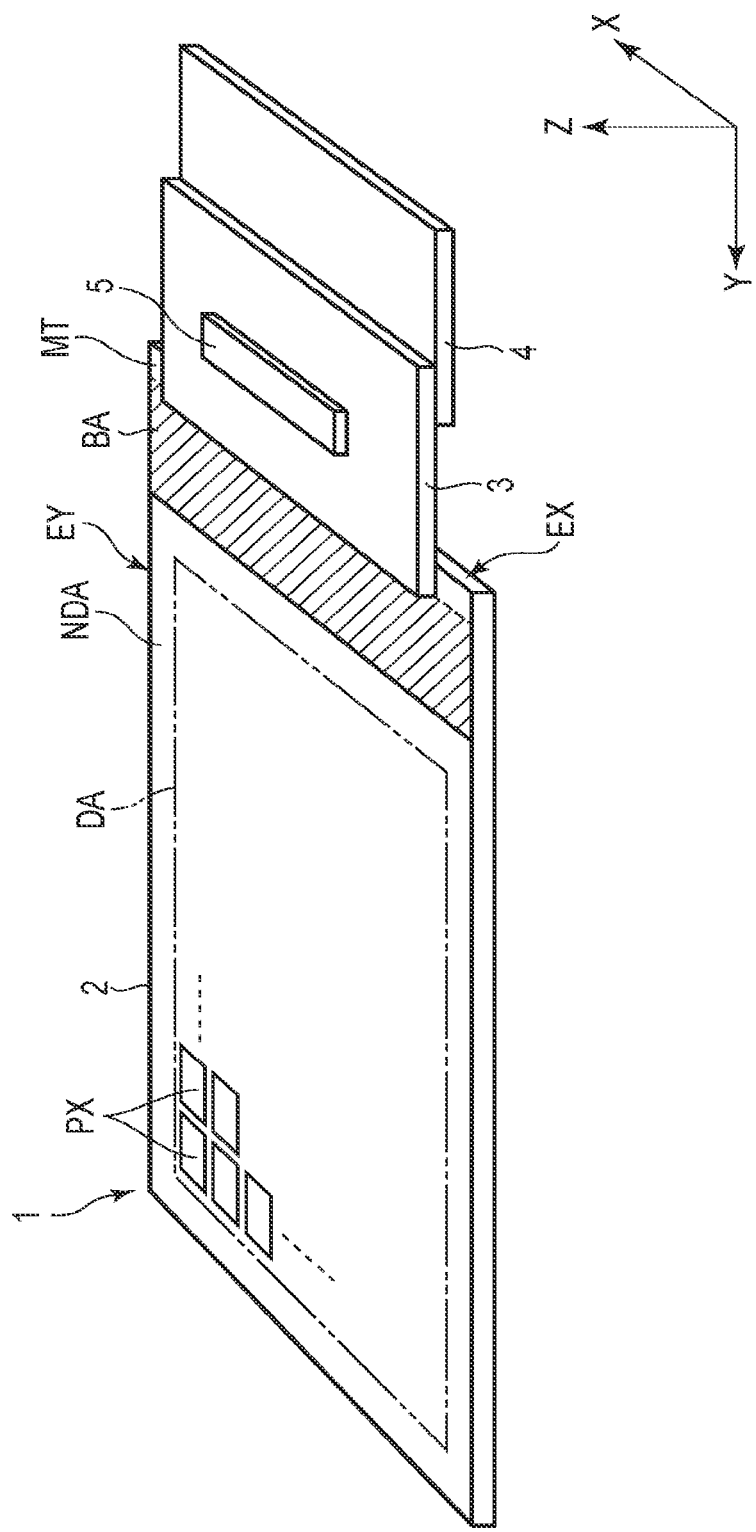
F I G. 1

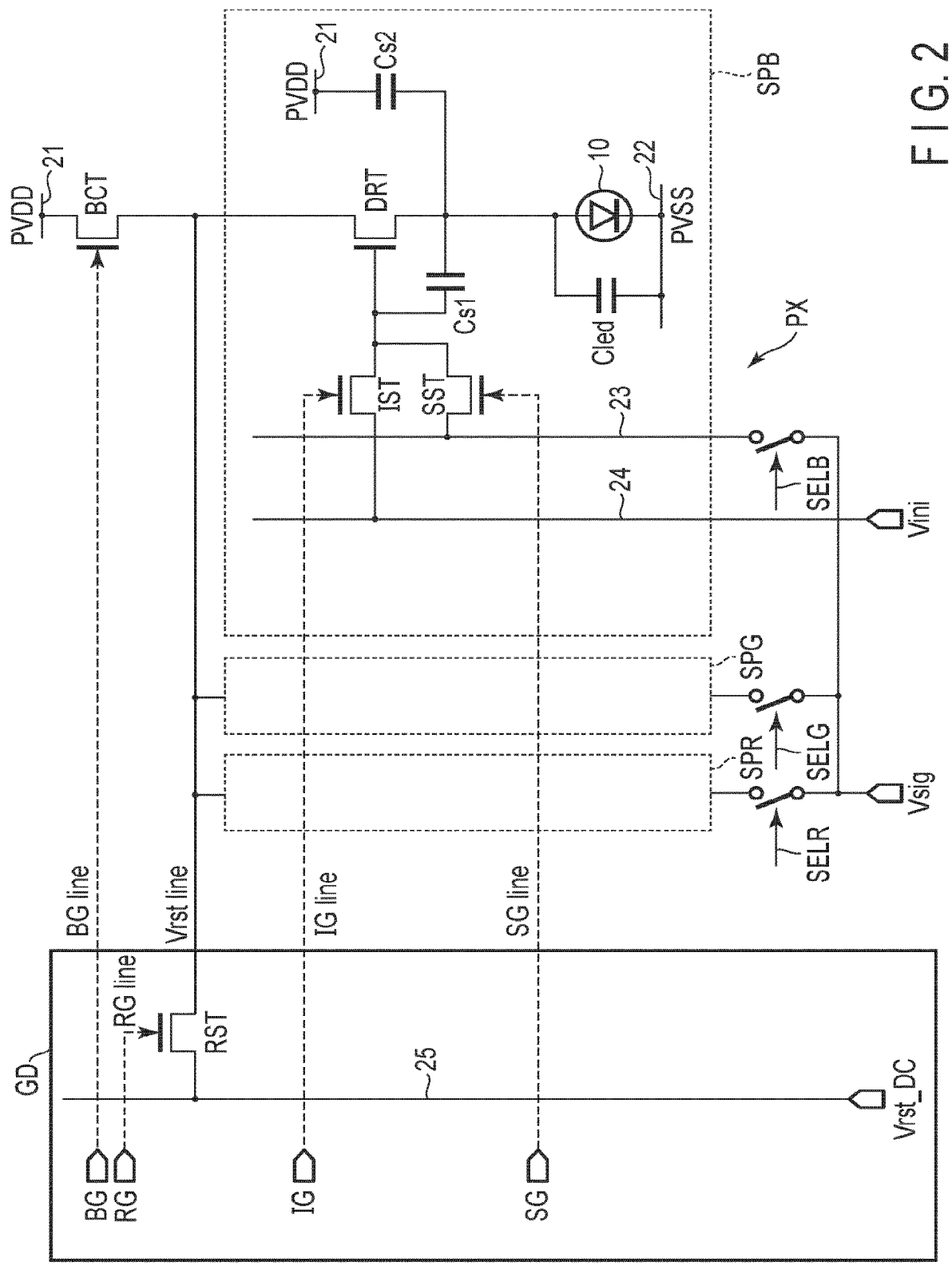
F I G. 2

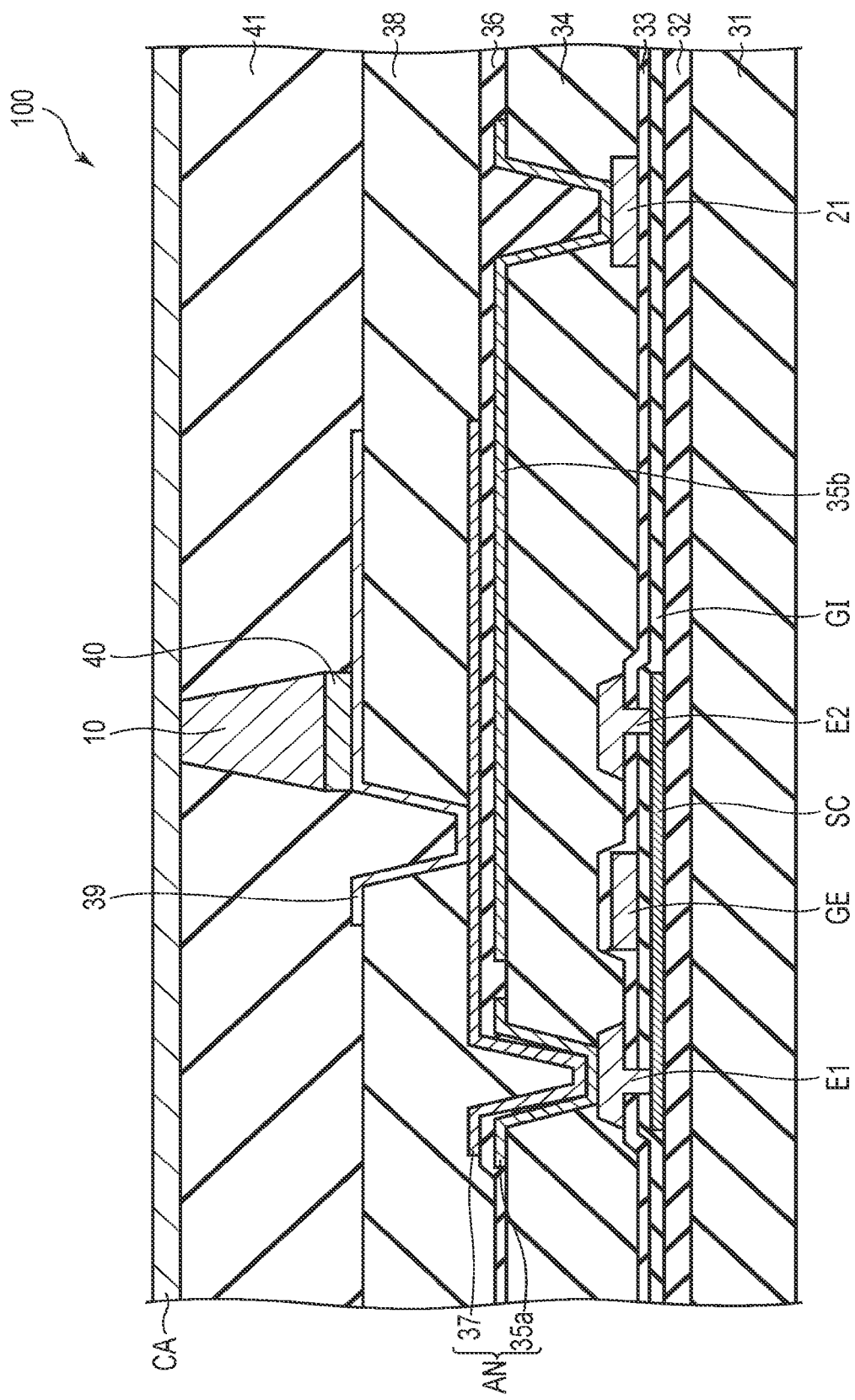
F I G. 4

DISPLAY DEVICE

CROSS-REFERENCE TO RELATED APPLICATIONS

This application is a Continuation Application of PCT Application No. PCT/JP2020/006032, filed Feb. 17, 2020 and based upon and claiming the benefit of priority from Japanese Patent Application No. 2019-051586, filed Mar. 19, 2019, the entire contents of all of which are incorporated herein by reference.

FIELD

Embodiments described herein relate generally to a display device.

BACKGROUND

LED displays using light-emitting diodes (LED), which are spontaneous light-emitting elements, are known, but in recent years, as display devices with higher resolution, display devices using micro diode elements called micro LEDs (hereinafter referred to as micro LED displays) has been developed.

Unlike conventional liquid crystal displays or organic EL displays, the micro LED displays are formed by mounting a large number of chip-shaped micro LEDs in the display area, which makes it easy to achieve both high resolution and large size, and are attracting attention as a next-generation displays.

In manufacture of such micro-LED displays, there is a method of mounting (bonding) micro-LEDs on a substrate by melting the solder material with a laser or the like.

However, in such a mounting method, the heat (thermal stress) generated when the solder material is molten may destroy the other elements that constitute the micro LED display, or may change the characteristics of the other elements.

BRIEF DESCRIPTION OF THE DRAWINGS

FIG. 1 is a perspective view schematically showing a configuration of a display device of an embodiment.

FIG. 2 is a diagram showing an example of the circuit configuration of the display device of the embodiment.

FIG. 4 is a diagram schematically showing an example of a cross-sectional structure of a display device according to a comparative example.

DETAILED DESCRIPTION

Figure 3:
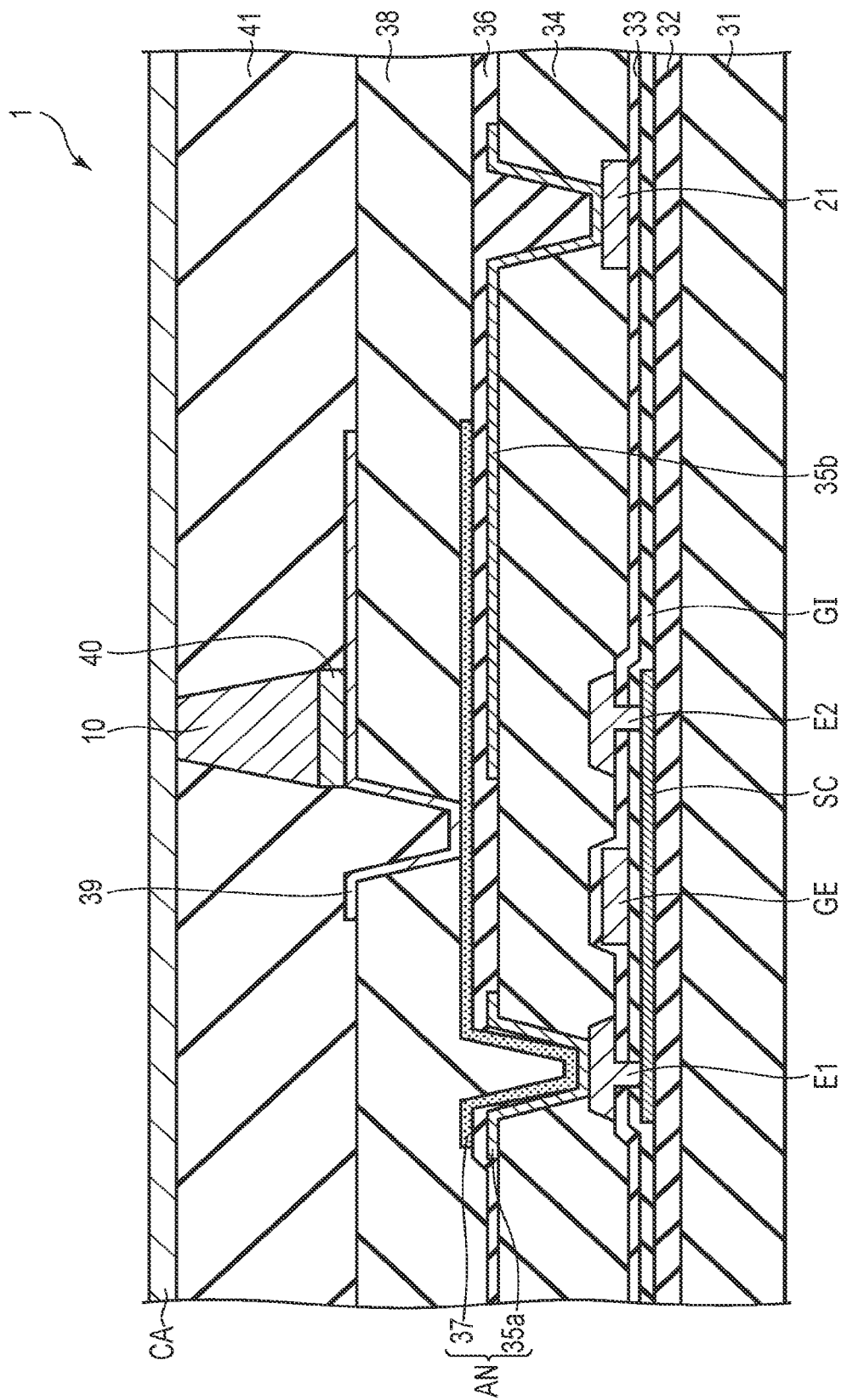
FIG. 3 is a diagram schematically showing an example of a cross-sectional structure of the display device of the embodiment.

In general, according to one embodiment, a display device comprises a display panel including a display area for displaying an image, and the display panel includes an insulating substrate, a first electrode provided on the insulating substrate, a first organic insulating layer covering the first electrode, an inorganic insulating layer provided on the first organic insulating layer, a pixel electrode provided on the inorganic insulating layer, a second organic insulating layer covering the pixel electrode, and a pad portion provided on the second organic insulating layer. The inorganic insulating layer comprises a first opening for electrically connecting the first electrode to the pixel electrode. The second organic insulating layer comprises a second opening for electrically connecting the pixel electrode to the pad portion. The pixel electrode is formed of a transparent conductive material.

Embodiments will be described hereinafter with reference to the accompanying drawings.

The disclosure is merely an example, and proper changes within the spirit of the invention, which are easily conceivable by a skilled person, are included in the scope of the invention as a matter of course. In addition, in some cases, in order to make the description clearer, the structures are schematically illustrated in the drawings, compared to the actual modes. However, the schematic illustration is merely an example, and adds no restrictions to the interpretation of the invention. Besides, in the specification and drawings, the same elements as those described in connection with preceding drawings are denoted by like reference numerals, and redundant explanations may be omitted.

FIG. 1 is a perspective view schematically showing a configuration of a display device 1 in this embodiment. FIG. 1 shows a three-dimensional space defined by a first direction X, a second direction Y orthogonal to the first direction X and a third direction Z orthogonal to the first direction X and the second direction Y. Note that the first direction X and the second direction Y are orthogonal to each other, but may intersect at an angle other than ninety degrees. Further, in the following descriptions, the third direction Z is referred to as "upward" and a direction opposite to the third direction is referred to as "downward". With such expressions "a second member above a first member" and "a second member below a first member", the second member may be in contact with the first member or may be remote from the first member.

In the following descriptions, the case where the display device 1 is a micro-LED display device (micro-LED display) using micro-LEDs, which are spontaneous light-emitting elements, will be mainly described.

As shown in FIG. 1, the display device 1 comprises a display panel 2, a first circuit board 3, a second circuit board 4 and the like.

The display panel 2 is, for example, rectangular in shape in. In the example illustrated in the figure, a short side EX of the display panel 2 is parallel to the first direction X, and a long side EY of the display panel 2 is parallel to the second direction Y. The third direction Z corresponds to the thickness direction of the display panel 2. A main surface of the display panel 2 is parallel to an X-Y plane defined by the first direction X and the second direction Y. The display panel 2 includes a display area DA and a non-display area NDA on an outer side of the display area DA. The non-display area NDA includes a terminal area MT. In the example illustrated in the figure, the non-display area NDA surrounds the display area DA.

The display area DA is an area which displays images and comprises a plurality of pixels PX arranged in a matrix, for example. The pixels PX each include a light-emitting element (micro-LED) and a switching element (drive transistor) for driving the light-emitting element.

The terminal area MT is provided along the short side EX of the display panel 2 and includes terminals which electrically connects the display panel 2 to an external device or the like.

The first circuit board 3 is mounted on a terminal region MT and is electrically connected to the display panel 2. The first circuit board 3 is, for example, a flexible printed circuit board. The first circuit board 3 comprises a drive IC chip (hereinafter referred to as a panel driver) 5 and the like, which drive the display panel 2. In the example illustrated in the figure, the panel driver 5 is placed above the first circuit board 3, but it may be placed below. Or, the panel driver 5 may be mounted on a member other than the first circuit board 3, for example, on the second circuit board 4. The second circuit board 4 is, for example, a flexible printed circuit board. The second circuit board 4 is connected to the first circuit board 3, for example, below the first circuit board 3.

The panel driver 5 described above is connected to a control board (not shown) via the second circuit board 4, for example. The panel driver 5 executes the control which displays images on the display panel 2 by driving a plurality of pixels PX based on video signals output from the control board, for example.

Note that the display panel 2 may include a fold (bend) area BA, which is indicated by hatch lines. The bend area BA is an area that is bent when the display device 1 is housed in a housing such as an electronic device. The bend area BA is located on a terminal region MT side of the non-display area NDA. In the state where the bend area BA is bent, the first circuit board 3 and the second circuit board 4 are placed below the display panel 2 so as to oppose the display panel 2.

Next, with reference to FIG. 2, the circuit configuration of the display device 1 will be described. As mentioned above, a plurality of pixels PX are arranged in a matrix in the display area DA. The pixels PX have a similar configuration. Therefore, in FIG. 2, one of the pixels PX is shown to represent all. The pixel PX includes, for example, three sub-pixels SPR, SPG and SPB.

The sub-pixels SPR, SPG, and SPB have a similar configuration. Therefore, for the sake of convenience, the configuration of the sub-pixel SPB (pixel circuit) will be mainly described here. As shown in FIG. 2, the sub-pixel SPB includes a light-emitting element 10, a drive transistor DRT, a pixel transistor SST, a initialization transistor IST, a reset transistor RST, a storage capacitance Cs1 and an auxiliary capacitance Cs2. The gate driver GD includes the reset transistor RST. Note that the output transistor BCT shown in FIG. 2 is provided for the sub-pixels SPR, SPG and SPB in each pixel. In FIG. 2, each transistor is of an n-channel type. An element capacitance Cled shown in FIG. 2 is the capacitance between an anode electrode and a cathode electrode of the light-emitting element 10. Note that the reset transistor RST, the pixel transistor SST, the initialization transistor IST and the output transistor BCT may not necessarily be constituted by transistors, respectively. The reset transistor RST, the pixel transistor SST, the initialization transistor IST and the output transistor BCT may be any members as long as they function as a reset switch, a pixel switch, and an output switch, respectively. A Vrst line functions as a reset wiring line, and a BG line, an RG line, an IG line, an SG line each function as to control wiring line.

In the following descriptions, one of source and drain terminals of the transistor is referred to as the first terminal and the other as the second terminal. Further, one of the terminals which form the element capacitance is referred to as the first terminal and the other as the second terminal.

The first terminal of the drive transistor DRT is connected to the first terminal of the element capacitance Cled, the first terminal of the storage capacitance Cs1, and the first terminal of the auxiliary capacitance Cs2. The second terminal of the drive transistor DRT is connected to the first terminal of the output transistor BCT. The second terminal of the drive transistor DRT is connected to the first terminal of the reset transistor RST via the Vrst line.

The second terminal of the output transistor BCT is connected to a first main power line 21. The second terminal of the element capacitance Cled is connected to a second main power line 22.

The first terminal of the pixel transistor SST is connected to the gate terminal of the drive transistor DRT, the first terminal of the initialization transistor IST, and the second terminal of the storage capacitance Cs1. The second terminal of the pixel transistor SST is connected to a pixel signal line 23.

The second terminal of the initialization transistor IST is connected to an initialization power line 24. The second terminal of the auxiliary capacitance Cs2 is connected to the first main power line 21. It suffices if the second terminal of the auxiliary capacitance Cs2 is connected to a constant potential line, and may be connected to a wiring line other than the first main power line 21.

Here, the reset transistor RST is provided in the gate driver GD located outside the sub-pixel SPB (pixel PX), and the second terminal of the reset transistor RST is connected to a reset power line 25.

Here, a first power potential PVDD is supplied to the first main power line 21, and a second power potential PVSS is supplied to the second main power line 22. The first power potential PVDD corresponds to the voltage for supplying an anode voltage to the light-emitting element 10, and the second power potential PVSS corresponds to a cathode voltage of the light-emitting element 10. Note that the first main power line 21 may be referred to as a common power wiring line.

Moreover, a pixel signal Vsig is supplied to the pixel signal line 23, an initialization voltage Vini is supplied to the initialization power line 24, and the reset power line 25 is set to the reset power potential Vrst. The pixel signal Vsig is a signal that is written to the pixel (in this case, the sub-pixel SPB) based on the video signal described above.

The gate terminal of the output transistor BCT is connected to the BG line. To the BG line, an output control signal BG is supplied.

The gate terminal of the pixel transistor SST is connected to the SG line. To the SG line, a pixel control signal SG is supplied.

The gate terminal of the initialization transistor IST is connected to the IG line. To the IG line, an initialization control signal IG is supplied.

The gate terminal of the reset transistor RST is connected to the RG line. To the RG line, a reset control signal RG is supplied.

In FIG. 2, all the transistors described above are assumed to be n-channel transistors, but for example, transistors other than the drive transistor DRT may be p-channel transistors, or n-channel and p-channel transistors may be mixedly present.

Further, it suffices if the display device 1 includes at least one gate driver GD. Although not illustrated in the figure for this embodiment, the display device 1 comprises two gate drivers GD. The gate drivers GD are provided not only on the left side of the pixel PX in FIG. 2, but also on the right side of the pixel PX. With this structure, it is possible to provide signals from both sides of the gate driver GD to a single pixel PX. Here, it is assumed that the above-described SG line is fed from both sides, while the other BG line, IG line, Vrst line and the like are fed from one side.

In the above, the configuration of the sub-pixel SPB is described, but the same descriptions apply to sub-pixels SPR and SPG as well.

The circuit configuration described in FIG. 2 is only an example, and the circuit configuration of the display device 1 can take some other structure as long as it includes at least a drive transistor DRT. For example, part of the circuit configuration described in connection with FIG. 2 may be omitted, or some other configuration may be added.

FIG. 3 schematically illustrates a cross-sectional structure of the display device 1. Here, an example in which a minute light-emitting diode element called micro LED as described above, is mounted on the anode electrode as a display element, will be described. Note that in FIG. 3, the display area DA comprising thin film transistors (TFTs) that constitute the pixels is mainly shown.

The array substrate AR of the display panel 2 shown in FIG. 3 comprises an insulating substrate 31. The insulating substrate 31 may be made of any material as long as it can withstand the processing temperature during the TFT process, but mainly a glass substrate such as of quartz or alkali-free glass, or a resin substrate such as of polyimide can be used. Resin substrates are flexible and can be used to construct a display device 1 as a sheet display. The resin substrate is not limited to polyimide, but other resin materials can be used as well. In view of the above, it may be more appropriate to refer to the insulating substrate 31 as an organic insulating layer or a resin layer.

On the insulating substrate 31, an undercoat layer 32 of a three-layer structure is provided. Although the details are not shown in the figure, the undercoat layer 32 includes a lower layer formed of silicon oxide (SiO2), a middle layer formed of silicon nitride (SiN), and an upper layer formed of silicon oxide (SiO2). In the undercoat layer 32, the lower layer is provided to improve adhesion to the insulating substrate 31, which is the base material, the middle layer is provided as a film for blocking moisture and impurities from outside, and the upper layer is provided as a blocking film to prevent hydrogen atoms contained in the middle layer from diffusing to a semiconductor layer SC side, which will be described later. The undercoat layer 32 may be further stacked, or may have a single- or a double-layer structure. For example, if the insulating substrate 31 is glass, the silicon nitride film may be formed directly on the insulating substrate 31 because the silicon nitride film has relatively good adhesion.

On the insulating substrate 31, light-shielding layers (not shown) are provided. The positions of the light-shielding layers are respectively aligned with the locations where the TFTs are to be formed later. The light-shielding layers can be made of a light-shielding material such as a metal layer or a black layer. The light-shielding layers can inhibit light from entering a rear side of the channels of the TFTs, thus making it possible to suppress the change in TFT characteristics, which may be caused by light entering from the insulating substrate 31 side. Note that in the case where the light-shielding layers are formed from a conductive layer, it is possible to impart a back gate effect to the TFTs by applying a predetermined potential to the light-shielding layers.

TFTs (for example, drive transistors DRT) are formed on the undercoat layer 32 described above. As an example of the TFT; a polysilicon TFT using polysilicon as the semiconductor layer SC is used. In this embodiment, the semiconductor layer SC is formed by using low-temperature polysilicon. The TFT may be either NchTFT or PchTFT. Or, NchTFT and PchTFT can be formed simultaneously. In the following descriptions, an example in which NchTFT is used as the drive transistor DRT will be described. The semiconductor layer SC of the NchTFT includes a first region, a second region, a channel region between the first and second regions, and low-concentration impurity regions respectively provided between the channel region and the first region, and between the channel region and the second region. One of the first and second regions functions as a source region, and the other functions as a drain region. The gate insulating film GI is made of silicon oxide film, and the gate electrode GE is made of molybdenum tungsten (MoW). The electrodes formed on the gate insulating film GI, such as the gate electrode GE, may be referred to as a first wiring or a first metal. In addition to its function as a gate electrode of the TFT, the gate electrode GE also has a function as a storage capacitive electrode as will be described below. Here, a top-gate TFT is described as an example, but the TFT may as well be of a bottom-gate type.

On the gate insulating film GI and the gate electrode GE, an interlayer insulating film 33 is provided. The interlayer insulating film 33 is configured such that for example, a silicon nitride film and a silicon oxide film are stacked in order on the gate insulating film GI and the gate electrode GE.

On the interlayer dielectric film 33, a first electrode E1, a second electrode E2 and the first main power line 21 are provided. The first electrode E1, the second electrode E2, and the first main power line 21 each adopt a three-layer structure (Ti-based material/Al-based material/Ti-based material), which includes a lower layer made of titanium (Ti) or a Ti-based metal material which contains Ti as a main component, such as a Ti-containing alloy, a middle layer made of aluminum (Al) or an Al-based metal material which contains Al as a main component, such as an Al-containing alloy, and a lower layer made of Ti or a Ti-based metal material which contains Ti as a main component, such as a Ti-containing alloy. Note that the electrodes formed on the interlayer insulating film 33, which include the first electrode E1, may be referred to as a second wiring line or second metal. The first electrode E1 is connected to the first region of the semiconductor layer SC, and the second electrode E2 is connected to the second region of the semiconductor layer SC. For example, when the first region of the semiconductor layer SC functions as a source region, the first electrode E1 is a source electrode and the second electrode E2 is a drain electrode. The first electrode E1 forms the storage capacitance Cs1 together with the interlayer insulating film 33 and the gate electrode (storage capacitance electrode) GE of the TFT. The first main power line 21 extends to an end portion of the circumferential edge of the insulating substrate 31 and forms a terminal for connecting the first circuit board 3 and the panel driver (drive IC) 5.

On the interlayer insulating film 33, the first electrode E1, the second electrode E2 and the first main power line 21, a planarization film 34 is formed to cover the TFT and the first main power line 21. For the planarization film 34, organic insulating materials such as photosensitive acrylics are often used, which has superior coverage of wiring steps and surface planarization, as compared to inorganic insulating materials formed by CVD or the like.

On the flattening film 34, a conductive layer 35 is provided. On the conductive layer 35, an insulating layer 36 is provided. For example, the insulating layer 36 is made of silicon nitride film. A pixel electrode 37 is provided on top of the insulating layer 36. The conductive layer 35 includes a conductive layer 35a that is in contact with the pixel electrode 37 through an opening in the insulating layer 36. Both the conductive layer 35a and the pixel electrode 37 are formed by a transparent conductive material such as indium tin oxide (ITO) or indium zinc oxide (IZO). The conductive layer 35a and the pixel electrode 37 may be collectively referred to as the anode electrode AN. The anode electrode AN is electrically connected to the first electrode E1 through an opening in the insulating layer 36. In the pixel section, the conductive layer 35 includes a conductive layer 35b. The conductive layer 35b is not formed directly below the position where the pad portion 39 and the anode electrode AN contact, as described below. The conductive layer 35b is formed by a transparent conductive material such as ITO or IZO. The conductive layer 35b, the insulating layer 36, and the anode electrode AN (pixel electrode 37) form the auxiliary capacitance Cs2.

On the insulating layer 36 and the anode electrode AN (pixel electrode 37), a planarization film 38 is provided. The planarization film 38 is formed of an organic insulating material such as photosensitive acrylic. The planarization film 38 comprises an opening for electrically connecting the anode electrode AN and a pad portion 39 used to mount the light-emitting element (micro LED) 10.

As described above, two planarization films 34 and 38 are provided in the display device 1. Here, the planarization films 34 and 38 have a thickness (film thickness) along the third direction Z as compared to the insulating layer formed of an inorganic insulating material, and therefore the advantage of excellent cushioning can be obtained as compared to the case where at least one of the planarization films 34 and 38 is an insulating layer formed of an inorganic insulating material.

In the display area DA, the light-emitting element 10 is mounted on the array substrate AR. Although only one light-emitting element 10 is shown in FIG. 3, in reality, light-emitting elements 10 with R, G and B emission colors are provided. Each light-emitting element 10 and the pad portion 39 are welded together by a solder material 40.

The light-emitting element 10 comprises a cathode electrode CA on a side opposite to the anode electrode AN. The cathode electrode CA needs to be formed as a transparent electrode to extract the light emitted from the light-emitting element 10, and is formed of a transparent conductive material such as ITO or IZO. The cathode electrode CA is connected to a wiring line provided on an array substrate AR side at a cathode contact portion (not shown) provided outside the display area DA. Between the planarization film 38 and the cathode electrode CA, an element insulating layer 41 is provided. The element insulating layer 41 is formed on the array substrate AR from a resin material that is filled in voids between the light-emitting elements 10.

Here, advantageous effects of the display device 1 of the present embodiment will be described by referring to a comparative example. Note that the comparative example will be provided to illustrate some of the effects to be exhibited by the display device 1 according this embodiment, and does not exclude the configuration and effects that are common to the comparative example and the present embodiment, from the scope of the present invention.

FIG. 4 schematically shows a cross-sectional structure of the display device 100 according to the comparative example. The display device 100 of the comparative example is different from the display device 1 of this embodiment in that the anode electrode AN is formed of a metal material and the conductive layer 35b extends to just below the position where the anode electrode AN and the pad portion 39 are in contact with each other.

In the display device 100 according to the comparative example, when the solder material 40 is molten to weld the light-emitting element 10 and the pad portion 39 together, the heat generated in the melting propagates through the pad portion 39, which is formed of a metal material, and transits to the anode electrode AN. As shown in FIG. 4, in the display device 100 of the comparative example, the anode electrode AN is also formed of a metal material, and therefore the heat transferred to the anode electrode AN propagates through the anode electrode AN and further transits to a layer below the anode electrode AN (for example, the conductive layer 35b, etc.). Due to this, the heat (thermal stress) that transits from the anode electrode AN may cause the conductive layer 35b to peel off from the planarization film 34 (occurrence of delamination) or the conductive layer 35b to crack. This is not desirable because the size of the auxiliary capacitance Cs2 formed by the anode electrode AN, the insulating layer 36 and the conductive layer 35b may vary. Further, the heat that transits from the anode electrode AN may change the TFT characteristics, which is also not desirable in this respect.

Figure 5:
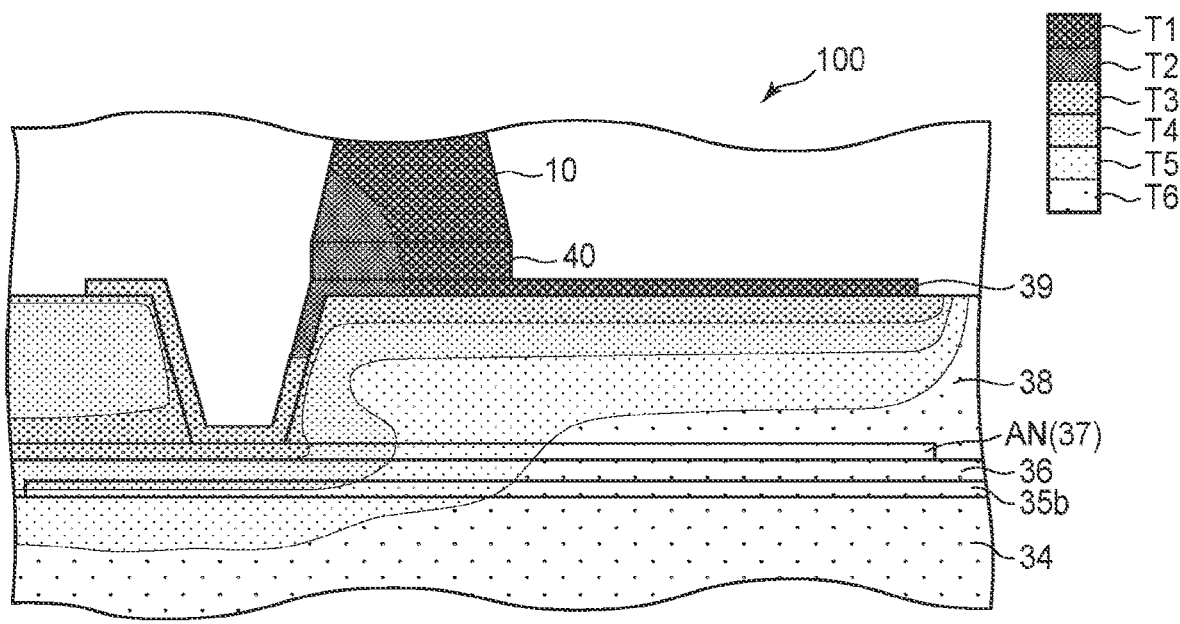
FIG. 5 is a diagram illustrating temperature change in the display device of the comparative example.

FIG. 5 schematically shows a part of the cross-sectional structure of the display device 100 in the comparative example. In FIG. 5, the higher the density of points, the higher the temperature of the part, and the lower the density of points, the lower the temperature of the part. Further, in FIG. 5, it is assumed that the temperatures of various parts of the display device 100 are categorized as a highest temperature T1, a high temperature T2, a medium-high temperature T3, a medium-low temperature T4, a low temperature T5 and a lowest temperature T6.

Figure 6:
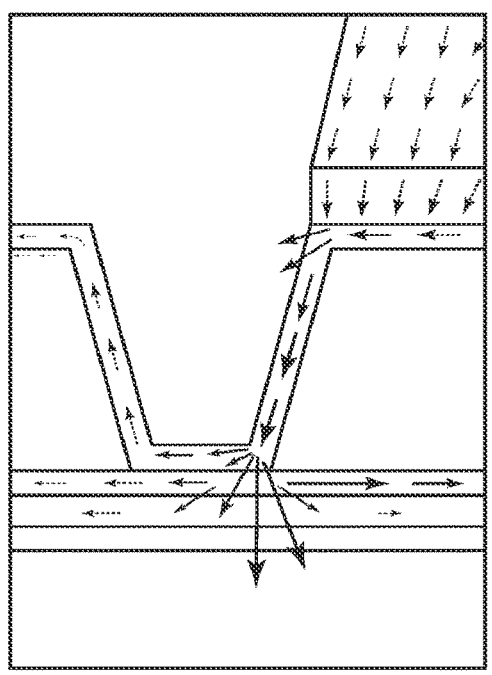
FIG. 6 is another diagram illustrating temperature change in the display device of the comparative example.

FIG. 6 schematically shows a part of the cross-sectional structure of the display device 100 in the comparative example. FIG. 6 illustrates the magnitude of the heat flux, wherein solid arrows indicate a large heat flux and dotted arrows indicate a small heat flux.

The heat generated in the melting of the solder material 40 propagates through the pad portion 39, which is formed by a metal material. Therefore, as shown in FIG. 5, for example, the temperature of a portion of the pad portion 39, close to the solder material 40 is at the highest temperature T1, and a portion thereof away from the solder material 40 and in contact with the anode electrode AN is at the medium-high temperature T3.

The heat propagating through the pad portion 39 transits to the anode electrode AN. The heat that transits to the anode electrode AN propagates through the anode electrode AN, which is formed of a metal material. Therefore, as shown in FIG. 5, for example, the temperature of a portion of the anode electrode AN, which is in contact with the pad portion 39 is at the medium-high temperature T3, which is so in the pad portion 39, and the temperature becomes lower as the medium-low temperature T4, the low temperature T5 and the lowest temperature T6 as the location is remote away from the contact portion.

Note that due to the fact that the anode electrode AN is formed of a metal material, the heat that has transited to the anode electrode AN tends to propagate through the anode electrode AN and diffuse throughout the anode electrode AN. Therefore, the heat propagating through the anode electrode AN is also widely transferred to the insulating layer 36 and the conductive layer 35b, which are located lower than the anode electrode AN, as shown in FIG. 5. Thus, the temperature of the conductive layer 35b is at the medium-low temperature T4 in the position directly below the contact portion between the anode electrode AN and the pad portion 39, and the temperature becomes lower as the low temperature T5 and the lowest temperature T6 as the location is remote away from the position.

Further, in the display device 100 of the comparative example, the temperature of the pad portion 39 is at the highest temperature T1 in a part close to the solder material 40 and it at the medium-high temperature T3 in the part remote from the solder material 40 and in contact with the anode electrode AN, as described above. Therefore, in terms of heat flux, the temperature gradient is great, and as shown in FIG. 6, the magnitude of the heat flux from the part close to the solder material 40 to the part in contact with the anode electrode AN tends to be high. Furthermore, in the display device 100 of the comparative example, the anode electrode AN is formed by a metal material, that is, a material having a high thermal conductivity, and therefore in terms of heat flux, the magnitude of the heat flux from the part in contact with the pad portion 39 to other parts also tends to increase, as shown in FIG. 6. In other words, as mentioned above, the heat that has transited to the anode electrode AN tends to propagate through the anode electrode AN and diffuse throughout the anode electrode AN.

As described above, in the display device 100 according to the comparative example, the heat tends to diffuse and increase the temperature of the conductive layer 35b due to the fact that the anode electrode AN is formed of a metal material, that is, a material with high thermal conductivity. When the temperature of the conductive layer 35b is high, the conductive layer 35b may peel off from the planarization film 34 or the conductive layer 35b may crack. Further, in the display device 100 of the comparative example, there is also a possibility that heat may diffuse and change the TFT characteristics due to the fact that the anode electrode AN is formed of a metal material, that is, a material with high thermal conductivity.

By contrast, in the display device 1 according to this embodiment, the anode electrode AN is formed from a transparent conductive material having low thermal conductivity, and therefore the heat that transits from the pad portion 39 to the anode electrode AN tends not to propagate through the anode electrode AN and not to diffuse throughout the anode electrode AN.

Figure 7:
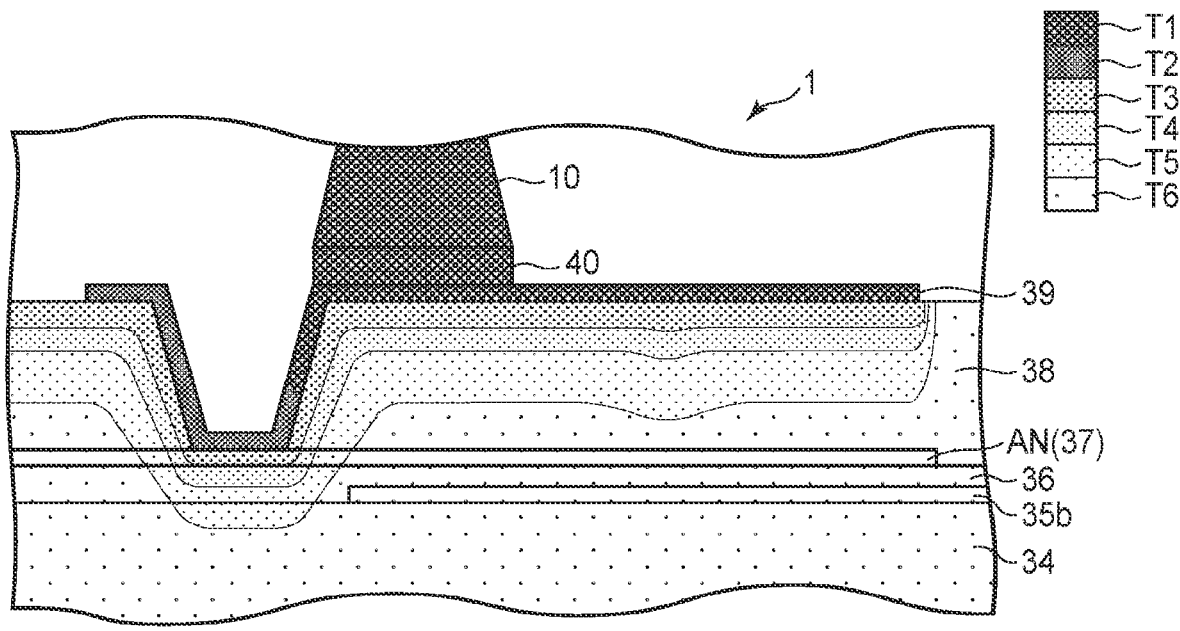
FIG. 7 is a diagram illustrating temperature change in the display device of the embodiment.

FIG. 7 schematically shows a part of the cross-sectional structure of the display device 1 of this embodiment. As in the case of FIG. 5, here, the higher the density of points, the higher the temperature of that part, and the lower the density of points, the lower the temperature of that part. In FIG. 7, it is assumed that the temperatures of various parts of the display device 1 are categorized as a highest temperature T1, a high temperature T2, a medium-high temperature T3, a medium-low temperature T4, a low temperature T5 and a lowest temperature T6.

Figure 8:
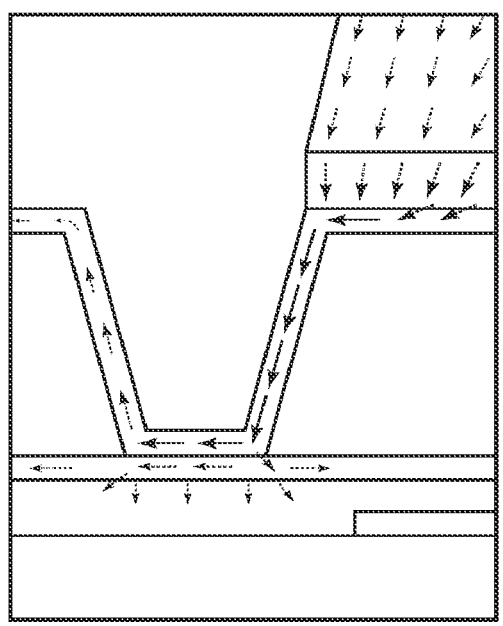
FIG. 8 is another diagram illustrating temperature change in the display device of the embodiment.

FIG. 8 schematically shows a part of the cross-sectional structure of the display device 1. As in the case of FIG. 6, this figure illustrates the magnitude of the heat flux, wherein solid arrows indicate a large heat flux and dotted arrows indicate a small heat flux.

The heat produced from the melting of the solder material 40 propagates through the pad section 39, which is formed of a metal material. Therefore, as shown in FIG. 7, for example, the temperature of the pad portion 39 is at the highest temperature T1 in the part close to the solder material 40, and the temperature is at the high temperature T2 in the part remote from the solder material 40 and in contact with the anode electrode AN.

The reason why the temperature of the part of the pad portion 39, which is in contact with the anode electrode AN is higher than that of the display device 100 in the comparative example is that the anode electrode AN is formed of a transparent conductive material with low thermal conductivity, which makes it difficult for the heat to diffuse (escape) to other parts.

The heat propagating through the pad portion 39 transits to the anode electrode AN. The heat transferred to the anode electrode AN does not easily propagate through the anode electrode AN due to the fact that the anode electrode AN is formed of a transparent conductive material with low thermal conductivity. Therefore, the temperature of the anode electrode AN is at the highest in the part which is in contact with the pad portion 39 and becomes lower as the location is remote away from the contact part, as the medium-high temperature T3, the medium-low temperature T4, the low temperature T5 and the lowest temperature T6 in a range narrower than that of the comparative example provided above.

The temperature of the anode electrode AN changes within a narrower range than the comparative example as described above, and therefore the heat transferred to the anode electrode AN does not diffuse as in the comparative example described above, but only transits to the insulating layer 36 and the planarization film 34 in the vicinity of the part in contact with the pad portion 39. Although the temperature of the anode electrode AN is high in the part in contact with the pad portion 39, the heat transferred to the anode electrode AN does not transit to the conductive layer 35b in the display device 1 of this embodiment, which is configured such that the conductive layer 35b is not formed directly below the part in contact with the pad portion 39.

Further, as shown in FIG. 8, in terms of heat flux as well, the temperature of the pad portion 39 is at the highest temperature T1 in the part close to the solder material 40 and is at the high temperature T2 in the part remote from the solder material 40 and in contact with the anode electrode AN. Therefore, the temperature gradient is small, and the magnitude of the heat flux from the part close to the solder material 40 to the part in contact with the anode electrode AN tends to decrease. Furthermore, the anode electrode AN is formed of a transparent conductive material with low thermal conductivity, and therefore, as shown in FIG. 8, it is possible to inhibit the inflow of the heat from the part in contact with the pad portion 39 to other portions.

Moreover, in the display device 1 of this embodiment, the anode electrode AN is formed of a transparent conductive material, and therefore it is possible to improve the aperture ratio of the display panel 2 (increase the transparent area of the display panel 2) as compared to that of the display device 100 according to the comparative example.

According to one embodiment described above, it is possible to provide a display device that is resistant to thermal stress which may be created when mounting micro LEDs.

Based on the display device described above as an embodiment of the present invention, all display devices that may be designed and modified by those skilled in the art as appropriate and implemented also belong to the scope of the present invention as long as they include the gist of the present invention.

A skilled person would conceive various changes and modifications of the present invention within the scope of the technical concept of the invention, and naturally, such changes and modifications are encompassed by the scope of the present invention. For example, if a skilled person adds/deletes/alters a structural element or design to/from/in the above-described embodiments, or adds/deletes/alters a step or a condition to/from/in the above-described embodiment, as long as they fall within the scope and spirit of the present invention, such addition, deletion and alternation are encompassed by the scope of the present invention.

Furthermore, regarding the present embodiments, any advantage and effect those will be obvious from the description of the specification or arbitrarily conceived by a skilled person are naturally considered achievable by the present invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
a display panel including a display area for displaying an image,
the display panel comprising:
an insulating substrate;
a first electrode provided on the insulating substrate;
a first organic insulating layer covering the first electrode;
an inorganic insulating layer provided on the first organic insulating layer;
a pixel electrode provided on the inorganic insulating layer;
a second organic insulating layer covering the pixel electrode; and
a pad portion provided on the second organic insulating layer,
the inorganic insulating layer comprising a first opening for electrically connecting the first electrode to the pixel electrode,
the second organic insulating layer comprising a second opening for electrically connecting the pixel electrode to the pad portion, and
the pixel electrode being formed of a transparent conductive material.

2. The display device of claim 1, wherein
the display panel further comprises a first conductive layer provided between the first organic insulating layer and the inorganic insulating layer, and
in the first opening, the first conductive layer is located between the first electrode and the pixel electrode, and connects the first electrode and the pixel electrode to each other.

3. The display device of claim 1, wherein
the display panel further comprises a light-emitting element provided to correspond to the pixel electrode, and
the light-emitting element is bonded on the pad portion with a solder material.

4. The display device of claim 3, wherein
the light-emitting element is a micro LED.

5. The display device of claim 1, wherein
the display panel further comprises a second conductive layer provided on the first organic insulating layer and opposing the pixel electrode via the inorganic insulating layer, and
the second conductive layer, the inorganic insulating layer and the pixel electrode form an auxiliary capacitance.

6. The display device of claim 5, wherein
the second conductive layer is not provided in an area opposing an area where the second opening is formed.

* * * * *